US010063027B2

(12) United States Patent
Kitajima

(10) Patent No.: US 10,063,027 B2
(45) Date of Patent: Aug. 28, 2018

(54) SEMICONDUCTOR LASER DEVICE AND METHOD OF MAKING THE SAME

(71) Applicant: ROHM CO., LTD., Ukyo-ku, Kyoto (JP)

(72) Inventor: Hisayoshi Kitajima, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 0 days.

(21) Appl. No.: 15/595,867

(22) Filed: May 15, 2017

(65) Prior Publication Data

US 2017/0338622 A1 Nov. 23, 2017

(30) Foreign Application Priority Data

May 17, 2016 (JP) ................................. 2016-098536

(51) Int. Cl.
| | |
|---|---|
| H01S 5/02 | (2006.01) |
| H01S 5/026 | (2006.01) |
| H01S 5/024 | (2006.01) |
| H01S 5/22 | (2006.01) |

(52) U.S. Cl.
CPC .......... *H01S 5/026* (2013.01); *H01S 5/02469* (2013.01); *H01S 5/22* (2013.01)

(58) Field of Classification Search
CPC ........ H01S 5/026; H01S 5/02469; H01S 5/22; H01S 5/02476; H01S 5/02461; H01S 5/02492; H01S 5/1003; H01S 5/1014; H01S 5/24; H01S 5/40; H01S 5/4025
See application file for complete search history.

(56) References Cited

U.S. PATENT DOCUMENTS

| | | | | |
|---|---|---|---|---|
| 5,513,200 A | * | 4/1996 | Paoli | ..................... H01S 5/4031 372/34 |
| 6,249,536 B1 | * | 6/2001 | Farries | .................. H01S 5/4031 372/108 |
| 2013/0243025 A1 | * | 9/2013 | Motoda | ............... H01S 5/02461 372/46.01 |

FOREIGN PATENT DOCUMENTS

JP    H0823133    1/1996

* cited by examiner

*Primary Examiner* — Armando Rodriguez
(74) *Attorney, Agent, or Firm* — Hamre, Schumann, Mueller & Larson, P.C.

(57) ABSTRACT

The present invention provides a semiconductor laser device for improving temperature characteristics of waveguide structures and realizing stable light emitting patterns and high output, and a method for making the same. The semiconductor laser device (1) comprises: an n-type clad layer (5) laminated on a substrate (2); an active layer (6) laminated on the n-type clad layer (5); a p-type clad layer (7) laminated on the active layer (6); and a plurality of waveguide structures (8) formed on the p-type clad layer (7) and having a ridge of a horn shape in top view. In this configuration, a divider (29) is formed between adjacent waveguide structures (8), and the divider (29) comprises: a groove (30) dividing the active layer (6); and a heat dissipation material (34) filled in the groove (30) and having a thermal conductivity higher than a thermal conductivity of a semiconductor layer (4).

15 Claims, 17 Drawing Sheets

SEM image showing a waveguide structure
formed by a conventional dry etching step SEM image showing a waveguide structure formed
by a dry etching step of the present invention

SEMICONDUCTOR LASER DEVICE AND METHOD OF MAKING THE SAME

BACKGROUND

The present invention relates to a semiconductor laser device and a method of making the same. In recent years, in the field of semiconductor laser devices, it is required that the generated light (laser) is highly outputted, and thus various types are proposed. For example, Patent Literature 1 discloses a semiconductor laser device with a waveguide structure having a ridge of a horn shape in top view as a type in which high output can be realized.

PRIOR TECHNICAL LITERATURE

Patent Literatures

[Patent Literature 1] Japanese Patent Application Laid-Open No. 8-23133

BRIEF SUMMARY OF THE INVENTION

Problems to be Solved

In order to realize further high output of a semiconductor laser device, the inventors of the present invention have studied the configuration of a plurality of waveguide structures having ridges of a horn shape in top view on the same substrate. It is considered that the light output can be theoretically increased in proportion to the number of waveguide structures by setting a plurality of waveguide structures.

However, in the configuration in which a plurality of waveguide structures are disposed, since the plurality of waveguide structures are oscillated at the same time, in the result that heat from one waveguide structure is conducted to adjacent waveguide structures, there is a concern that the waveguide structures reach a high temperature exceeding an operating temperature due to thermal interference. When the waveguide structures reach a high temperature, the light output of the semiconductor laser device is reduced. In addition, when a temperature difference is generated between a plurality of waveguide structures, uneven light output is generated between the plurality of waveguide structures, and as a result, the design of the light output cannot be obtained, and the stability of the light emitting pattern is also impaired.

Therefore, the object of the present invention is to provide a semiconductor laser device capable of improving temperature characteristics of a waveguide structure and achieving stable light emitting patterns and high output and a method for manufacturing the same.

Technical Means for Solving Problems

The semiconductor laser device of the present invention comprises a substrate; a first conductivity type clad layer on the substrate; an active layer on the first conductivity type clad layer; a second conductivity type clad layer on the active layer; and a plurality of waveguide structures formed on the second conductivity type clad layer and each having a ridge of a horn shape in top view. In this configuration, a divider is formed between adjacent waveguide structures. The divider comprises a groove for dividing the active layer, and a heat dissipation material filled in the groove and having a thermal conductivity higher than a thermal conductivity of the semiconductor layer.

Effects of the Present Invention

The semiconductor laser device of the present invention is conFIG.d as the following configuration, i.e. a divider is formed between adjacent waveguide structures for dividing the active layer. The divider comprises a groove for dividing the active layer, and a heat dissipation material filled in the groove and having a thermal conductivity higher than a thermal conductivity of a semiconductor layer. By way of the divider, heat generated from the plurality of waveguide structures is conducted between the waveguide structures, so as to inhibit generation of a temperature difference between the plurality of waveguide structures.

That is, by way of the divider, the heat generated from the plurality of waveguide structures is dissipated to the outside, and the plurality of waveguide structures can be made close to a soaking state, i.e. a state that there is less temperature difference between the plurality of waveguide structures. Hence, thermal interference generated between the plurality of waveguide structures can be well suppressed. Accordingly, a semiconductor laser device capable of realizing stable light emitting patterns and high output is provided.

DETAILED DESCRIPTION

Hereinafter, embodiments of the present invention will be described in detail with reference to the accompanying drawings.

Figure 1:
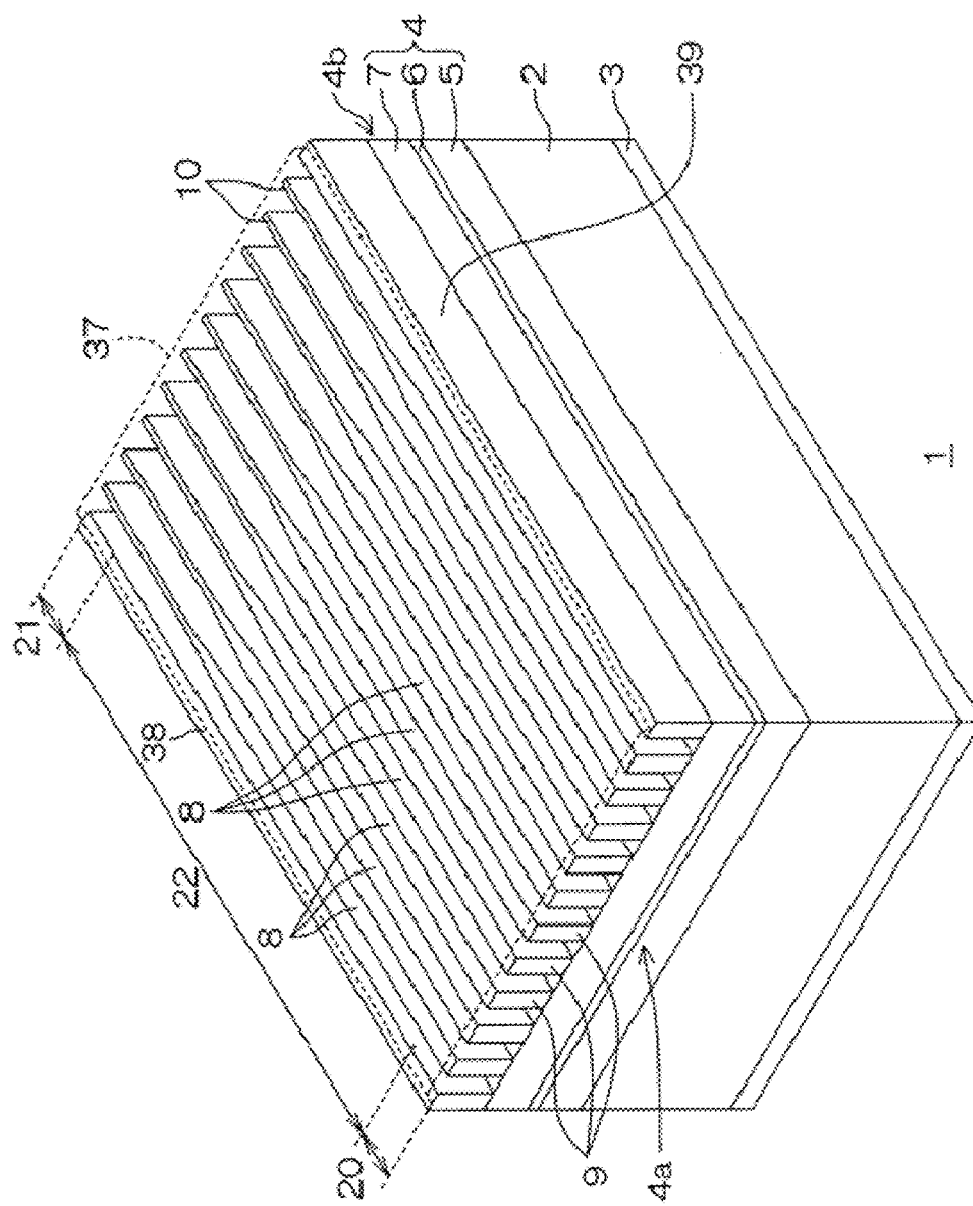
FIG. 1 is a perspective view showing a semiconductor laser device according to an embodiment of the present invention.
Figure 2:
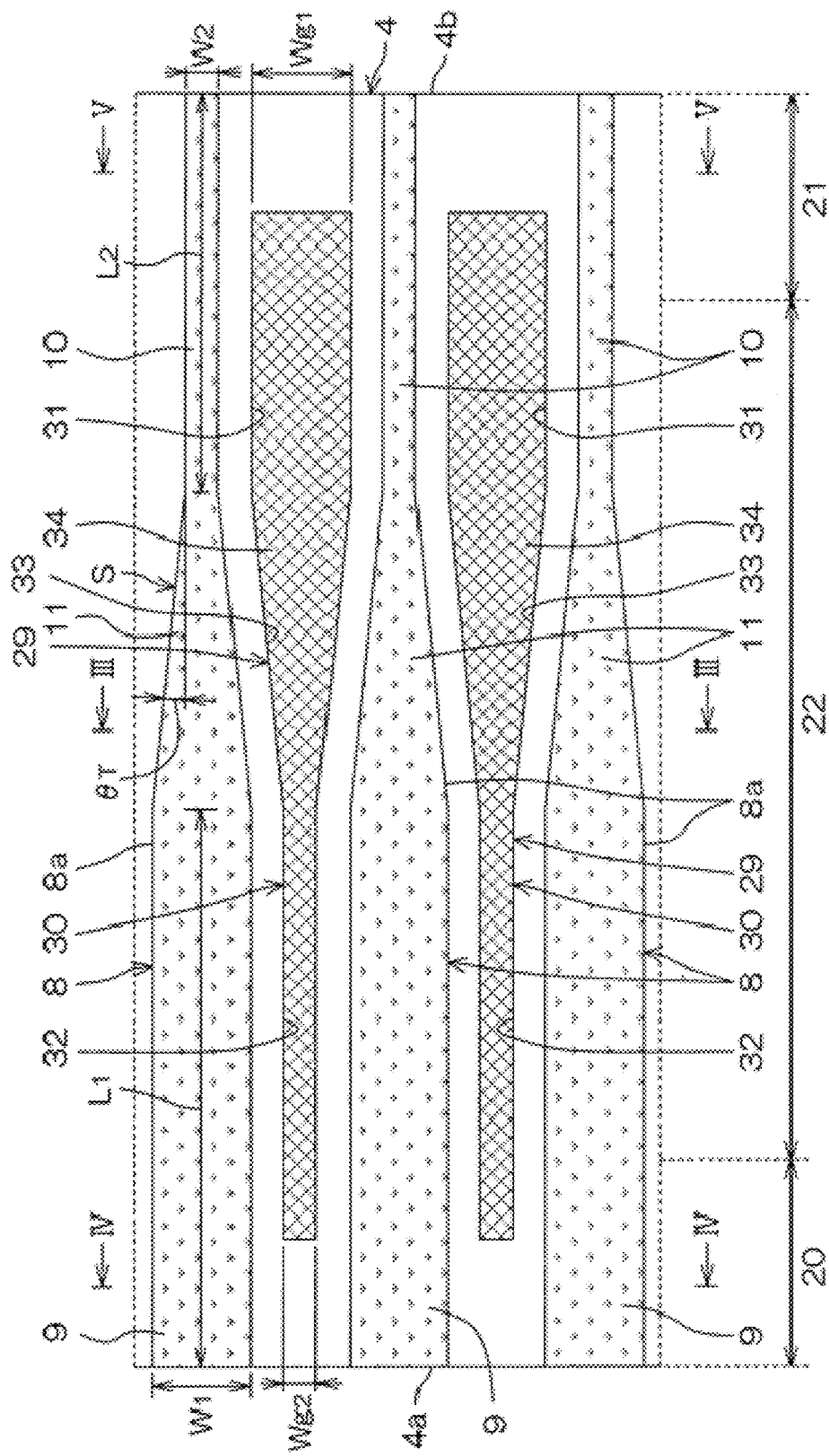
FIG. 2 is an enlarged top view showing a plurality of waveguide structures shown in FIG. 1.
Figure 3:
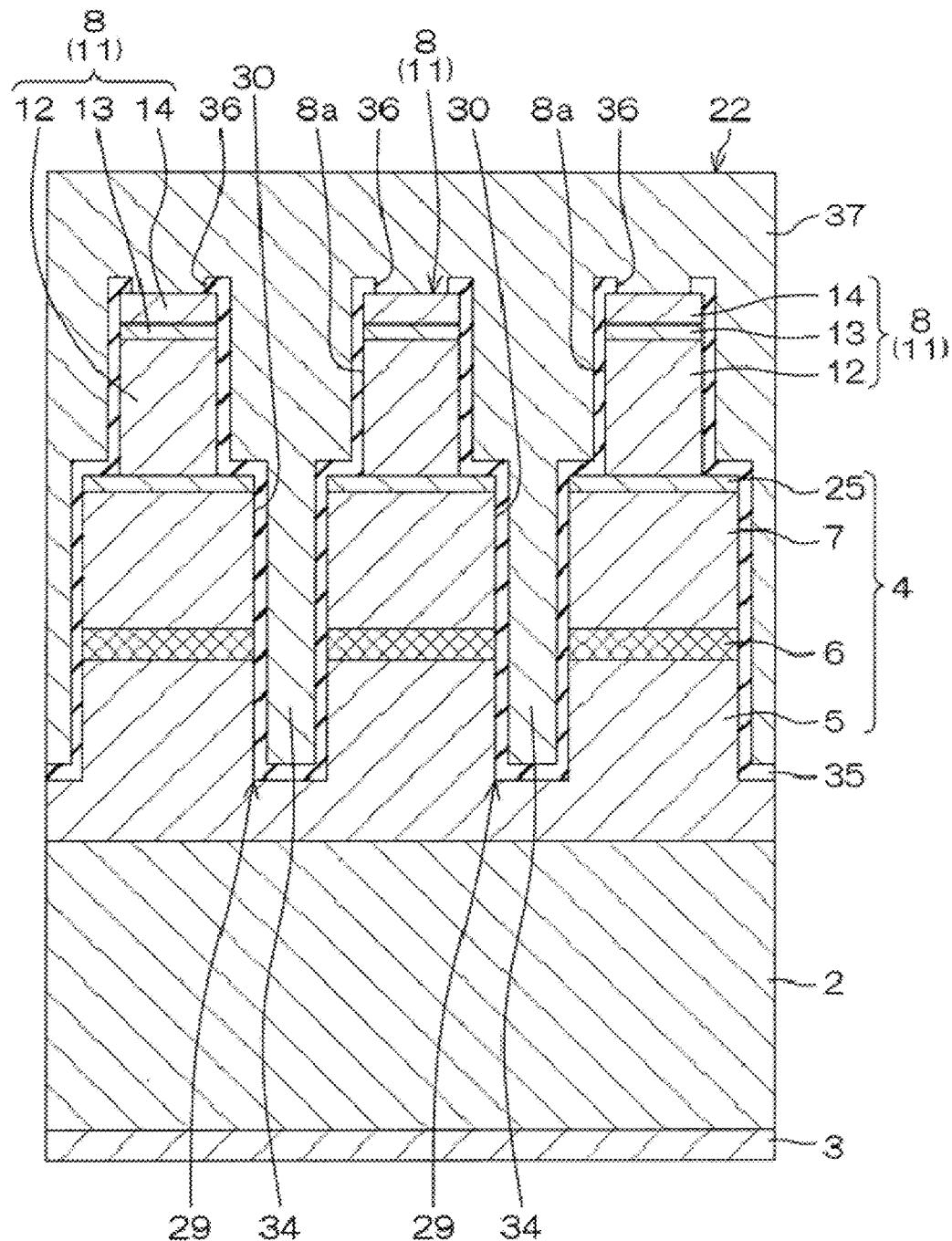
FIG. 3 is a longitudinal cross-sectional view taken along the line III-III shown in FIG. 2.
Figure 4:
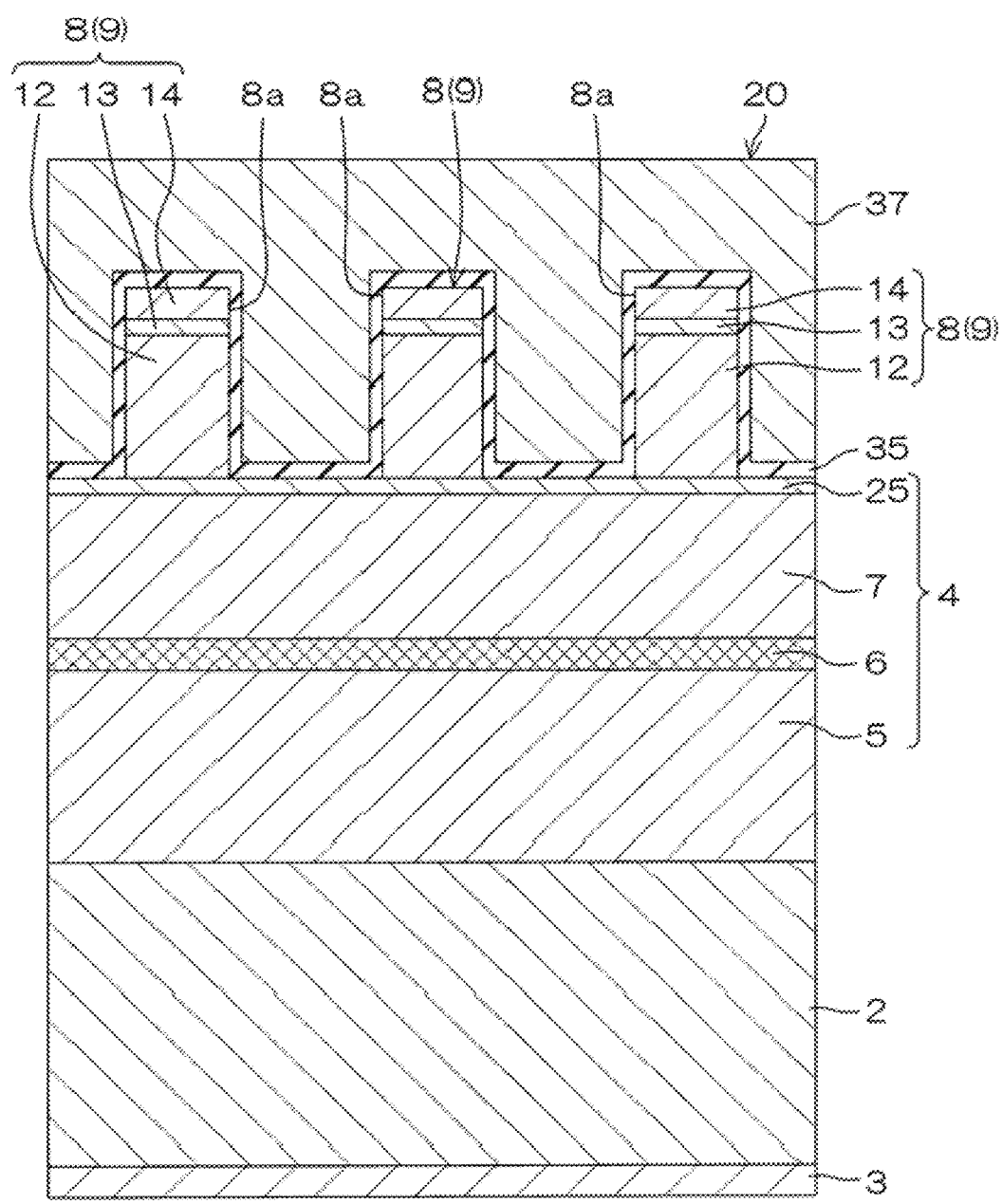
FIG. 4 is a longitudinal cross-sectional view taken along the line IV-IV shown in FIG. 2.
Figure 5:
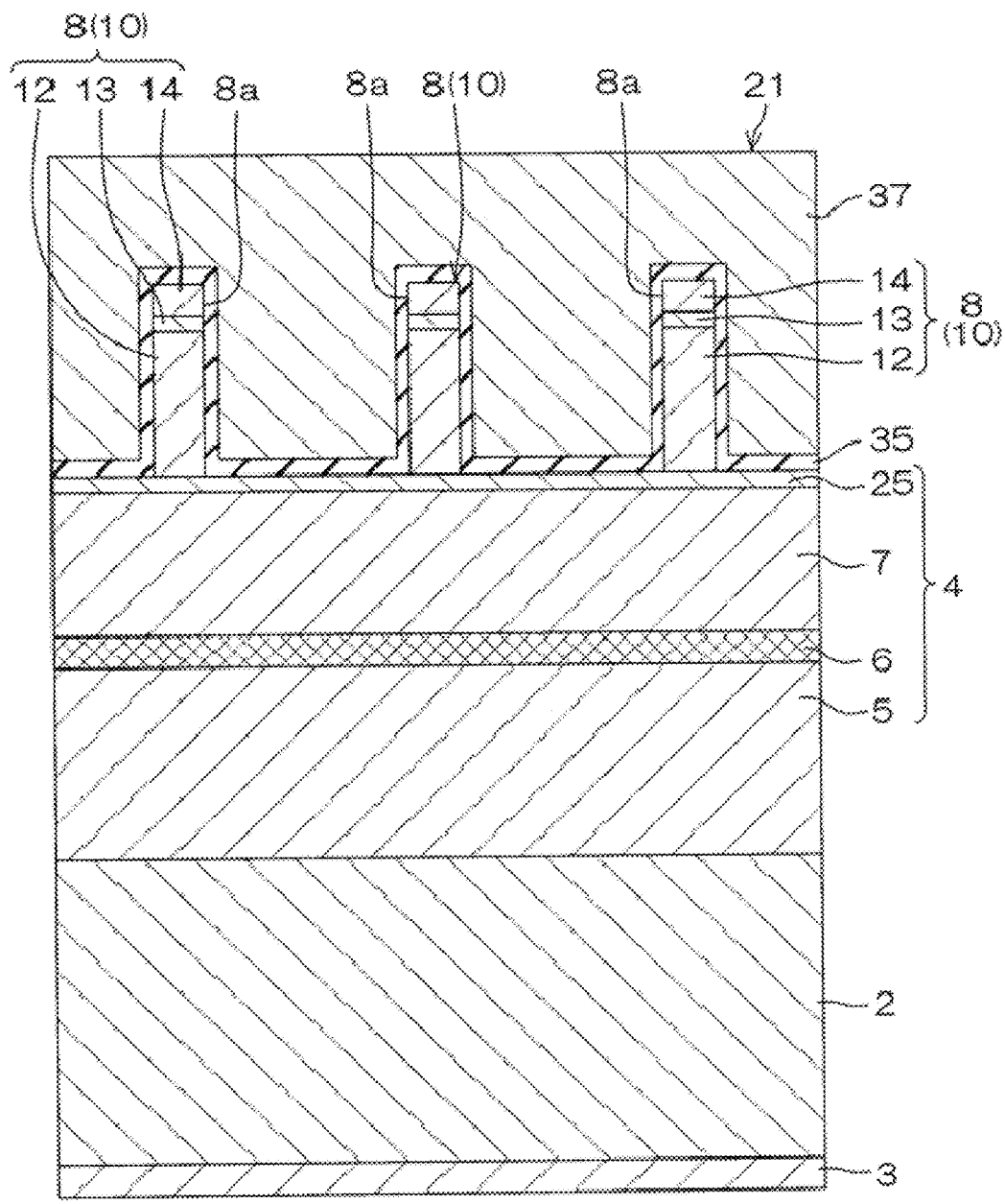
FIG. 5 is a longitudinal cross-sectional view taken along the line V-V shown in FIG. 2.

FIG. 1 is a perspective view showing a semiconductor laser device 1 according to an embodiment of the present invention. FIG. 2 is an enlarged top view showing several waveguide structures 8 shown in FIG. 1. FIG. 3 is a longitudinal cross-sectional view taken along the line III-III shown in FIG. 2. FIG. 4 is a longitudinal cross-sectional view taken along the line IV-IV shown in FIG. 2. FIG. 5 is a longitudinal cross-sectional view taken along the line V-V shown in FIG. 2.

The semiconductor laser device 1 is, for example, a compound semiconductor laser diode having an operating voltage $V_{OP}$ of 3 V or less and emitting light (laser) having a peak emission wavelength in a range from 700 nm to 1000 nm. The semiconductor laser device 1 comprises an n-type substrate 2. The substrate 2 can be, for example, an n-type GaAs substrate. The substrate 2 is formed in a rectangular shape in top view, and includes a front surface, a back surface opposite to the front surface, and a side surface connected to the front surface and the back surface. The substrate 2 may be a deviation substrate set to have a specific deviation angle (for example, a deviation angle of about 10°).

A back surface metal 3 is formed on the back surface side of the substrate 2, and a semiconductor layer 4 is formed on the front surface side of the substrate 2. The semiconductor layer 4 has a side surface of a cleavage plane formed on the same plane as the side surface of the substrate 2, the side surface at one end portion of the substrate 2 is set as an exit end portion 4a, and the side surface at another end portion of the substrate 2 is set as a non-exit end portion 4b. The semiconductor layer 4 has a double-hetero structure comprising an n-type clad layer 5 laminated on the substrate 2; an active layer 6 laminated on the n-type clad layer 5; and a p-type clad layer 7 laminated on the active layer 6.

The n-type clad layer 5 is a layer for supplying electrons to the active layer 6 and enclosing the light generated from the active layer 6 in the active layer 6. The n-type clad layer 5 can include a compound semiconductor layer to which arsenic (As) or phosphorus (P) is added. The n-type clad layer 5 can be, for example, an n-type AlGaAs layer or an n-type InGaAlP layer.

Referring to FIGS. 1 to 5, a plurality of (10 in the present embodiment) waveguide structures 8, each having a ridge (a ridge structure) of a horn shape in top view, are formed on the semiconductor layer 4. In FIG. 2, each waveguide structure 8 is indicated by light hatching for clarity. One waveguide structure 8 is conFIG.d to, for example, emit light up to about 250 mW in the present embodiment.

Referring to FIG. 2, the plurality of waveguide structures 8 are all formed so as to extend along the long side direction of the substrate 2 in top view and are spaced apart from each other in the short side direction of the substrate 2. That is, the plurality of waveguide structures 8 are arranged in a stripe shape in top view. Hereinafter, the direction in which the waveguide structures 8 extend is referred to as "stripe direction". The stripe direction is the long side direction of the substrate 2 in the present embodiment. The space between the waveguide structures 8 is, for example, 10 m to 30 μm (20 μm in the present embodiment).

Each waveguide structure 8 is conFIG.d to have a horn shape in top view in which the width of the ridge gradually changes in the stripe direction. More specifically, each waveguide structure 8 comprises: a first region 9 disposed on a side of the exit end portion 4a and extending in a rectangular shape with a specific ridge width $W_1$; a second region 10 disposed on a side of the non-exit end portion 4b and extending in a rectangular shape with a ridge width $W_2$ smaller than the ridge width W1 ($W_2 < W_1$); and a tapered region 11 connecting the first region 9 and the second region 10 in such a manner that the ridge width is gradually narrowed from the first region 9 to the second region 10. Therefore, each waveguide structure 8 has a horn shape in top view in which the ridge width is gradually narrowed from the exit end portion 4a to the non-exit end portion 4b.

The waveguide structure 8 has six parameters: the ridge width $W_1$ of the first region 9, the length $L_1$ in the long side direction of the first region 9, the ridge width $W_2$ of the second region 10, the length $L_2$ in the long side direction of the second region 10, the taper angle $\theta_T$ of the tapered region 11, and the area S of the waveguide structure 8 in top view. By optimizing these six parameters, a good series resistance component $R_S$ and a good operating current $I_{OP}$ can be realized, and suppression of kink (phenomenon of loss of the linearity between the current and light output characteristics) and high output can both be achieved.

Referring to FIGS. 3 to 5, each waveguide structure 8 has a ridge projecting upward from the semiconductor layer 4. Each waveguide structure 8 has a vertical ridge with a side surface 8a rising vertically with respect to the surface of the substrate 2. With a vertical ridge, in comparison with a waveguide structure 8 having a tapered ridge with a side surface 8a inclined with respect to the surface of the substrate 2, the area of the current path is increased, whereby the series resistance component $R_S$ can be reduced.

Referring to FIGS. 1 to 5, a first window region 20 having a specific width extending in the stripe direction is conFIG.d at the end portion on the side of the exit end portion 4a of the waveguide structure 8, and a second window region 21 having a specific width extending in the stripe direction is conFIG.d at the end portion on the side of the non-exit end portion 4b of the waveguide structure 8. The first window region 20 and the second window region 21 are current non-injection regions where no current is injected into the waveguide structure 8. A current injection region for injecting current into the waveguide structure 8 is conFIG.d in an inner region 22 between the first window region 20 and the second window region 21 of each waveguide structure 8.

The semiconductor layer 4 further includes a p-type etching stop layer 25 interposed between the p-type clad layer 7 and the waveguide structure 8. The p-type etching stop layer 25 is a layer for suppressing the etching process for forming the waveguide structure 8 (p-type ridge clad layer 12) from reaching the p-type clad layer 7. The p-type etching stop layer 25 includes a compound semiconductor material having an etching selectivity with respect to the waveguide structure 8 (p-type ridge clad layer 12). The p-type etching stop layer 25 may be, for example, a p-type AlGaAs layer or a p-type InGaAlP layer with a composition ratio different from the composition ratio of the p-type ridge clad layer 12.

Referring to FIG. 2 and FIG. 3, the semiconductor laser device 1 of the present embodiment is characterized in that a divider 29 is formed between adjacent waveguide structures 8. The divider 29 comprises: a groove 30 for dividing the active layer 6 and a heat dissipation material 34 filled in the groove 30 and having a thermal conductivity higher than a thermal conductivity of the semiconductor layer 4.

Referring to FIG. 2, the groove 30 of the divider 29 is disposed between adjacent waveguide structures 8, and is formed to extend along the waveguide structure 8, and a width of the groove (a width of the opening) changes according to a space between the waveguide structures 8. In FIG. 2, each groove is indicated by dark cross hatching for clarity.

FIG. 2 is an example showing the groove 30 formed of a horn shape in top view which is a pattern opposite to that of the waveguide structure 8. That is, the groove 30 comprises: a first region 31 disposed at the side of the non-exit end portion 4b and extending in a rectangular shape with a specific groove width $W_{g1}$ (a width of opening); a second region 32 disposed at the side of the exit end portion 4a and extending in a rectangular shape with a groove width $W_{g2}$ (a width of opening) smaller than the groove width $W_{g1}$ of the first region 31 ($W_{g2}<W_{g1}$); and a tapered region 33 connecting the first region 31 and the second region 32 in such a manner that the groove width (a width of the opening) is gradually narrowed from the first region 31 to the second region 32.

Referring to FIG. 3, the groove 30 has a depth that divides the p-type etching stop layer 25, the p-type clad layer 7 and the active layer 6, and reaches the n-type clad layer 5. The bottom of the groove 30 is disposed in the n-type clad layer 5, and faces to the surface of the substrate 2 via a portion of the n-type clad layer 5. In the present embodiment, it is an example showing that the groove 30 is dug in the direction of the deposition of the semiconductor layer 4 (the direction perpendicular to the surface of the substrate 2). However, it can also be that the groove 30 has a tapered shape with an width of an opening gradually narrowed from the surface of the semiconductor layer 4 to the surface of the substrate 2.

Referring to FIG. 3, the heat dissipation material 34 of the divider 29 is embedded in the groove 30 through an insulating film 35. In the present embodiment, the heat dissipation material 34 is formed of a metal having a thermal conductivity higher than the thermal conductivity of the semiconductor layer 4 and the thermal conductivity of the waveguide structures 8. The heat dissipation layer 34 can comprise at least one meal material selected from a group including copper, aluminum, gold and silver. The metal material of the heat dissipation material 34 is not limited to the above meal materials. Any metal material having a thermal conductivity higher than the thermal conductivity of the semiconductor layer 4 and the thermal conductivity of the waveguide structures 8 can be properly used as the metal material of the heat dissipation material 34.

One surface of the insulating film 35 (the surface on the side of the substrate 2) and the other surface opposite thereto are formed along the inner wall surface of the groove 30. The insulating film 35 is, for example, a silicon nitride film or a silicon oxide film. The inner wall surface of the groove 30 is covered by the insulting film 35, and also the outer surface (including the side surface 8a and an upper surface) of each waveguide structure 8 is covered by the insulating film 35. A contact hole 36 for selectively exposing a p-type contact layer 14 is formed in a portion of the insulating film 35 disposed in the inner region 22 (current injection region). On the other hand, referring to FIG. 4 and FIG. 5, no contact hole 36 is formed in portions of the insulating film 35 disposed in the first window region 20 and the second window region 21 (current non-injection regions).

Referring to FIG. 1 and FIGS. 3 to 5, a surface metal 37 is formed on the insulating film 35 so as to coat the insulating film 35. The surface metal 37 is indicated by a dotted line in FIG. 1. The surface metal 37 enters the contact hole 36 from the insulating film 35, and is electrically connected to the p-type contact layer 14 in the contact hole 36.

The surface metal 37 is formed of a metal material having a thermal conductivity higher than the thermal conductivity of the semiconductor layer 4 and the thermal conductivity of the waveguide structure 8. The surface metal 37 can comprise at least one metal material selected from a group including copper, aluminum, gold and silver. The metal material of the surface metal 37 is not limited to the above metal materials. Any metal material having a thermal conductivity higher than the thermal conductivity of the semiconductor layer 4 and the thermal conductivity of the waveguide structures 8 can be properly used as the metal material of the surface metal 37.

In the present embodiment, a portion of the surface metal 37 enters the groove 30, and the portion of the surface metal 37 in the groove 30 is used as the heat dissipation material 34. Therefore, heat generated from the waveguide structures 8 is dissipated to the outside of the semiconductor laser device 1 through the surface metal 37 (the heat dissipation material 34). In the present embodiment, the example in which the heat dissipation material 34 is formed by a portion of the surface metal 37 is illustrated, but the heat dissipation material 34 can be formed of a material different from the material of the surface metal 37.

Referring to FIG. 1 again, on the semiconductor layer 4 (the p-type etching stop layer 25), a first base portion 38 and a second base portion 39 are formed to extend in the stripe direction so as to sandwich all the waveguide structures 8. The first base portion 38 is formed on a side surface along the long side direction of the substrate 2, and the second base portion 39 is formed on the other side surface along the long side direction of the substrate 2. The first base portion 38 and the second base portion 39 have the same laminated structure (not shown) as the waveguide structure 8. An upper surface and an inner side (the side facing the waveguide structure 8) of the first base portion 38 and the second base portion 39 are covered with the insulating film 35. That is, the first base portion 38 and the second base portion 39 are electrically insulated from all the waveguide structures 8 by the insulating film 35.

The surface metal 37 is formed to cover a part of the upper surface of the first base portion 38 and a part of the upper surface of the second base portion 39. A configuration in which the first base portion 38 and the second base portion 39 are not present may be used. In this case, the surface metal 37 can be formed on the insulating film 35 to cover the plurality of waveguide structures 8.

In the above descriptions, the semiconductor laser device 1 according to the present embodiment is conFIG.d to have the divider 29 between adjacent waveguide structures 8 for dividing the active layer 6. The divider 29 comprises the groove 30 for dividing the active layer 6, and the heat dissipation material 34 filled in the groove 30 and having a thermal conductivity higher than a thermal conductivity of the semiconductor layer 4. By the divider 29, the heat generated from the plurality of waveguide structures 8 can be conducted between the plurality of waveguide structures 8, so as to suppress the generation of a temperature difference between the plurality of waveguide structures 8.

That is, by the divider 29, the heat generated from the plurality of waveguide structures 8 can be dissipated to the outside, and the plurality of waveguide structures 8 are close to a soaking state, i.e. a state that there is less temperature difference between the plurality of waveguide structures. Hence, thermal interference between the plurality of waveguide structures can be well suppressed. Accordingly, a semiconductor device 1 capable of realizing stable light emitting patterns and high output is provided.

In addition, in the semiconductor laser device 1 of the present embodiment, the groove 30 of the divider 29 is formed with a groove width (a width of an opening) which changes according to the space between the waveguide structures. Therefore, the volume of the heat dissipation material 34 embedded in the groove 30 is efficiently increased in a limited space, such that the heat generated from the plurality of waveguide structures 8 can be well conducted therebetween. Additionally, the heat generated from the plurality of waveguide structures 8 can be well dissipated to the outside.

The n-type clad layer 5 and the p-type clad layer 7 are composed of compound semiconductor layers to which arsenic (As) or phosphorus (P) is added. For example, in the case where the n-type clad layer 5 and the p-type clad layer 7 are composed of a compound semiconductor layer to which arsenic (As) is added, the operating voltage $V_{OP}$ can be reduced in comparison with the case where phosphorus (P) is added, and thus it is considered that the generation of heat can be suppressed. However, arsenic (As) causes greater environmental burden than phosphorus (P).

In the semiconductor laser device 1 of the present embodiment, even in the case that phosphorus (P) is added to replace arsenic (As) in the n-type clad layer 5 and the p-type clad layer 7, as described above, by the divider 29, the temperature rise of the waveguide structures 8 can be suppressed and a stable light emitting pattern and high output can be realized. Hence, the semiconductor laser device 1 is provided for reducing environmental burden.

FIGS. 6A to 6H are longitudinal cross-sectional views showing a step of a method for manufacturing the semiconductor laser device 1 shown in FIG. 1. FIGS. 6A to 6H are enlarged cross-sectional views of the portions corresponding to FIG. 3.

Figure 6A:
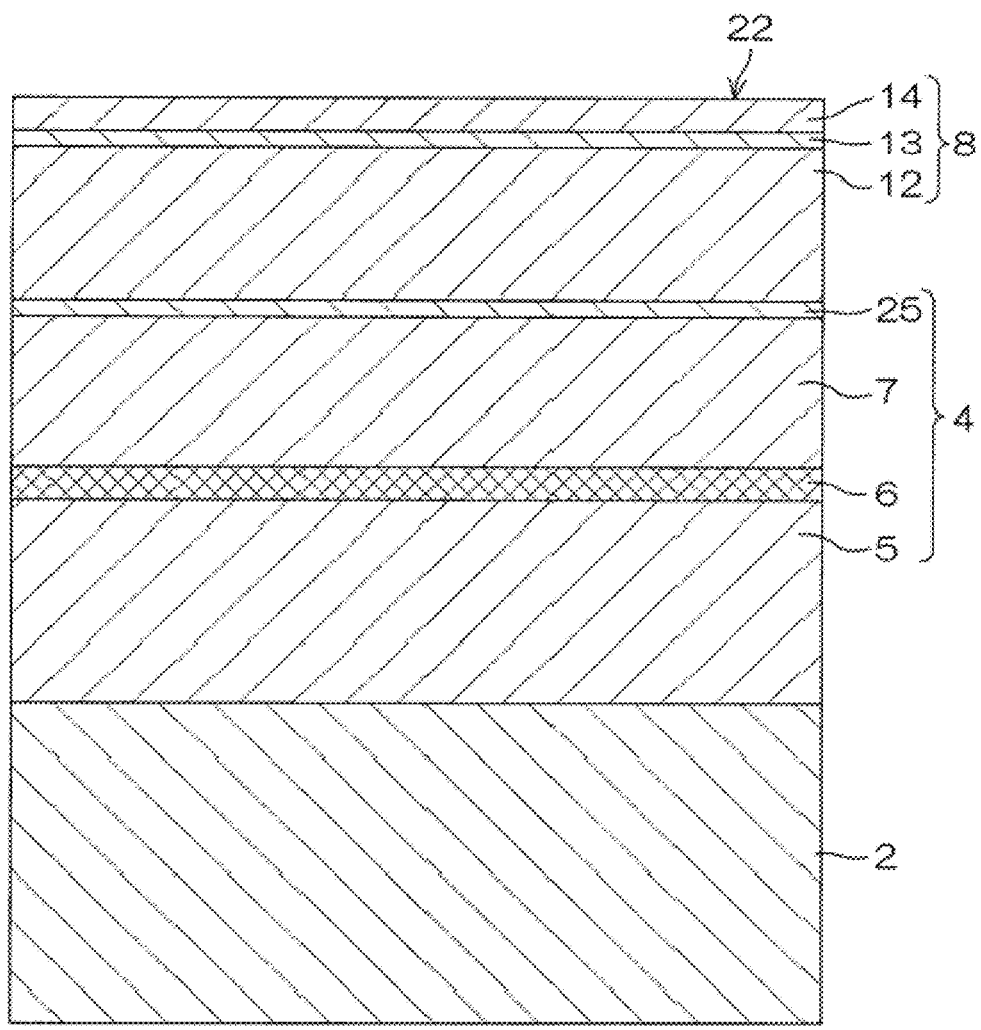
FIG. 6A is a longitudinal cross-sectional view showing a step of a method for manufacturing a semiconductor laser device shown in FIG. 1.

Referring to FIG. 6A, while manufacturing a semiconductor laser device 1, a substrate 2 is prepared first. Then, various semiconductor material layers (compound semiconductor material layers), which are the bases of an n-type clad layer 5, an active layer 6, a p-type clad layer 7, a p-type etching strop layer 25, a p-type ridge clad layer 12, a p-type discontinuous buffer layer 13 and a p-type contact layer 14, are sequentially formed on the substrate 2 by, for example, an epitaxial growth method. Hence, a laminated structure comprising an n-type clad layer 5, an active layer 6, a p-type clad layer 7, a p-type etching stop layer 25, a p-type ridge clad layer 12, a p-type discontinuous buffer layer 13 and a p-type contact layer 14 is formed.

Figure 6B:
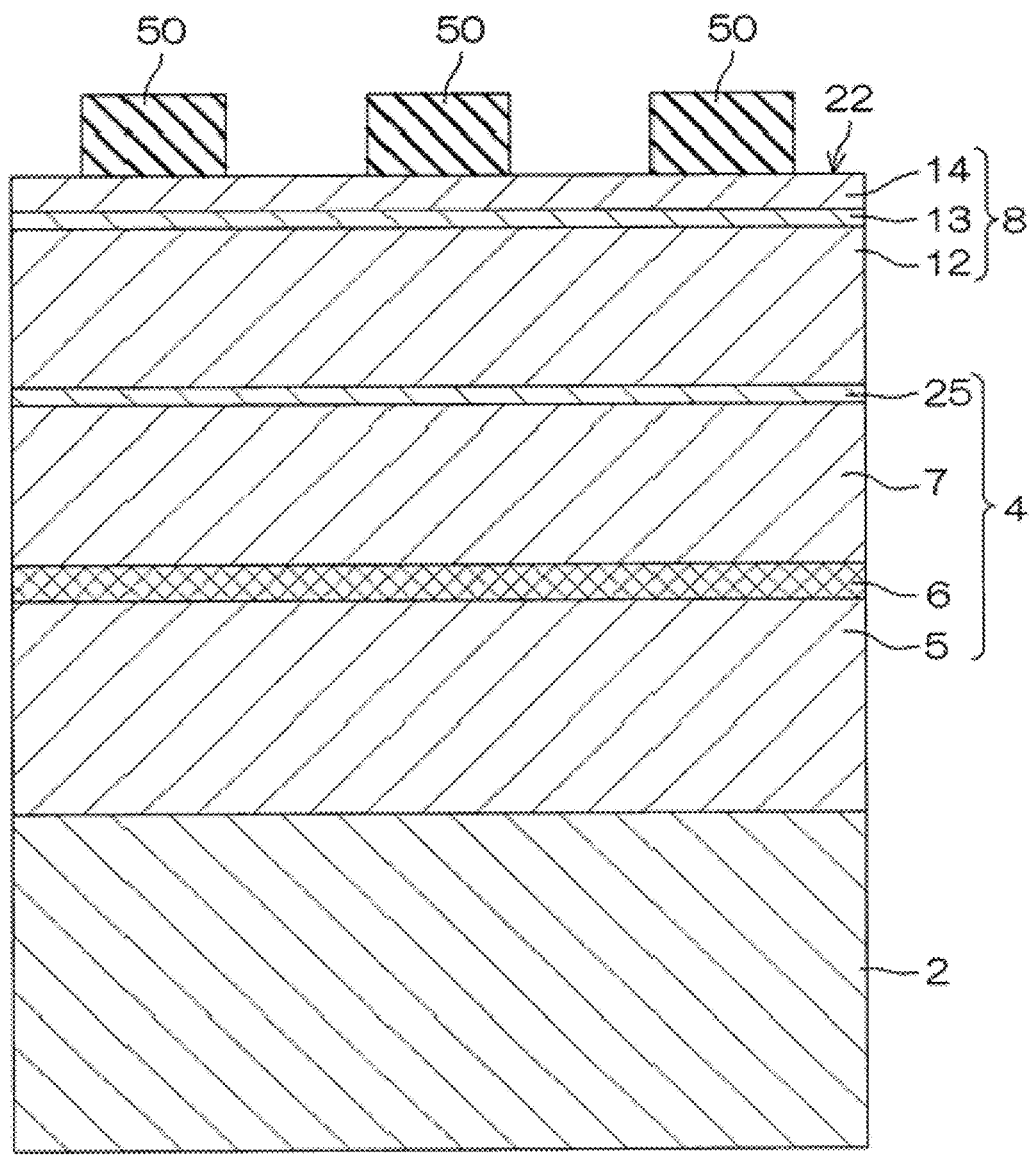
FIG. 6B is a longitudinal cross-sectional view showing a next step of FIG. 6A.
Figure 6C:
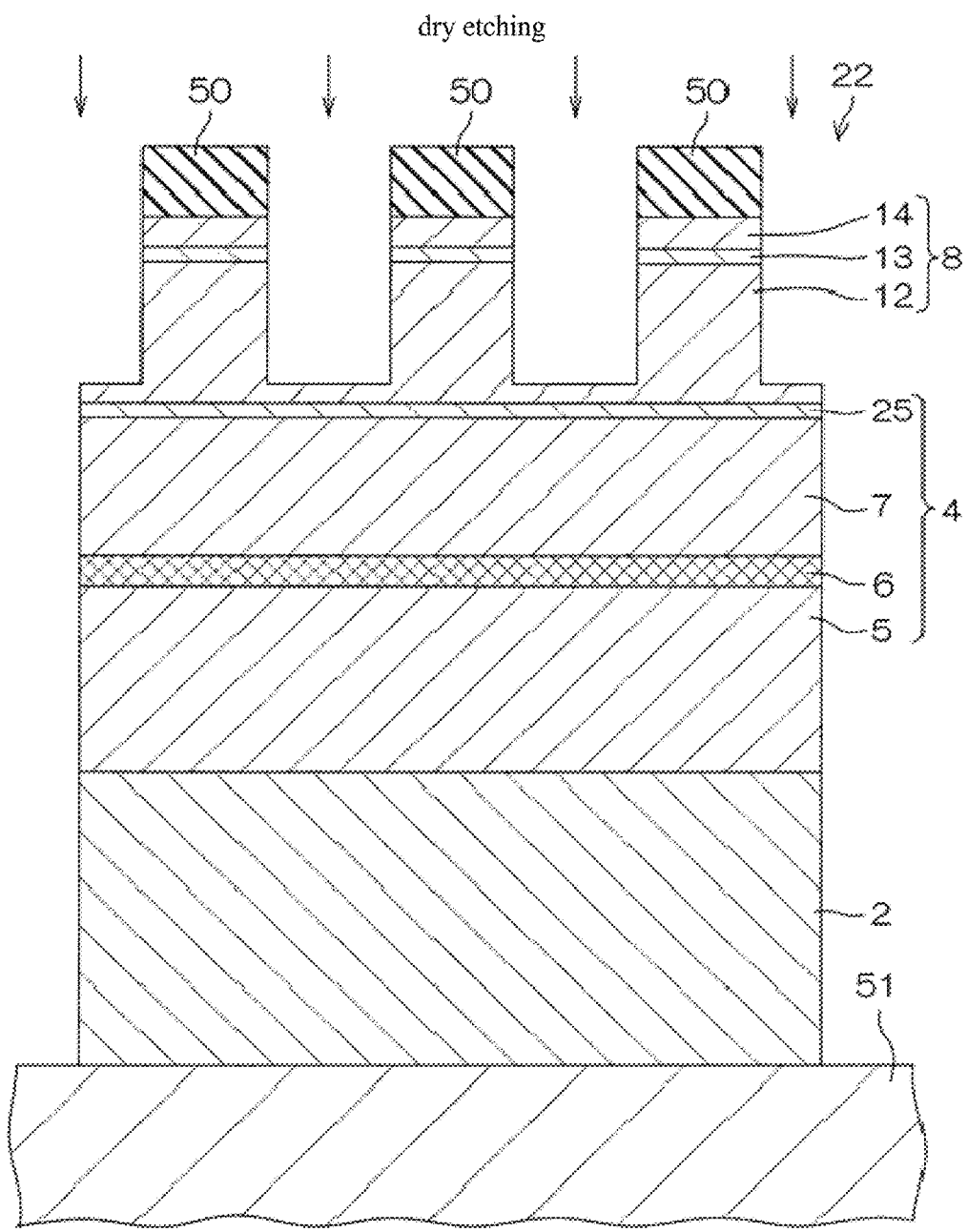
FIG. 6C is a longitudinal cross-sectional view showing a next step of FIG. 6B.

Then, referring to FIG. 6B, a hard mask 50 containing silicon oxide is formed on the p-type contact layer 14 so as to cover the region where the waveguide structure 8 is to be formed. Then, referring to FIG. 6C, a dry etching (for example, RIE (Reactive Ion Etching)) with the hard mask 50 is performed. The dry etching step is performed in a state where the substrate 2 is placed on a heating stage 51.

One method for performing the dry etching step is using $Cl_2$ gas and setting the temperature of the heating stage 51 to about 80° C. (hereinafter, referred to as a conventional dry etching step). However, in the conventional dry etching step, in the case that the p-type contact layer 14, the p-type discontinuous buffer layer 13 and/or the p-type ridge clad layer 12 include indium (In), there is a concern that the $Cl_2$ gas reacts with indium (In) with the progress of etching to form a nonvolatile indium chloride layer. The indium chloride layer adheres to the sidewall portion of the p-type contact layer 14, the p-type discontinuous buffer layer 13, and the p-type ridge clad layer 12 formed during etching.

Figure 7A:
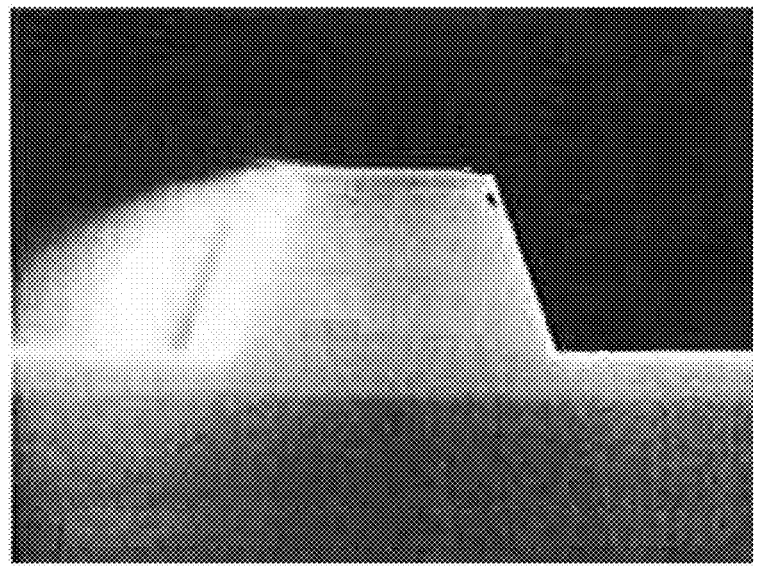
FIG. 7A is an SEM image showing a waveguide structure formed by a conventional dry etching step.

When the indium chloride layer adheres, the etching amount of the sidewall portion on the side of the p-type contact layer 14 having a longer exposure time in the $Cl_2$ gas atmosphere is relatively increased, and the etching amount of the side wall portion on the side of the p-type ridge clad layer 12 having a shorter exposure time in the $Cl_2$ gas atmosphere is relatively decreased. As a result, the SEM (Scanning Electron Microscope) image of the waveguide structure 8 formed by the conventional dry etching step in FIG. 7A shows that the waveguide structure 8 has a tapered ridge with a side surface 8a inclined downward with respect to the surface of the substrate 2.

In this embodiment, in the case that the p-type contact layer 14, the p-type discontinuous buffer layer 13, and/or the p-type ridge clad layer 12 contain indium (In), $SiCl_4$ gas is used, and the heating stage 51 is set to a temperature exceeding 80° C., for example, about 100° C.; to 200° C. (more specifically about 150° C.), and the dry etching step is performed. In this dry etching step, the p-type contact layer 14, the p-type discontinuous buffer layer 13 and the p-type ridge clad layer 12 are selectively removed in such a manner that a portion of the p-type ridge clad layer 12 is retained, i.e. the p-type etching stop layer 25 is not exposed.

According to the dry etching step of the present embodiment, the indium chloride formed with the progress of the etching is appropriately decomposed by the action of $SiCl_x$ radical as a reducing agent, such that the difference between the amount of etching on the p-type contact layer 14 side and the amount of etching on the p-type ridge clad layer 12 is suppressed.

In addition, although silicon-based fine particles generated from the $SiCl_4$ gas may adhere to the side surface 8a of the waveguide structure 8, as the temperature of the heating plate 51 is increased, the silicon-based fine particles are detached from the side surface 8a of the waveguide structure 8. Therefore, the waveguide structure 8 having the side surface 8a with a good state is formed.

Figure 6D:
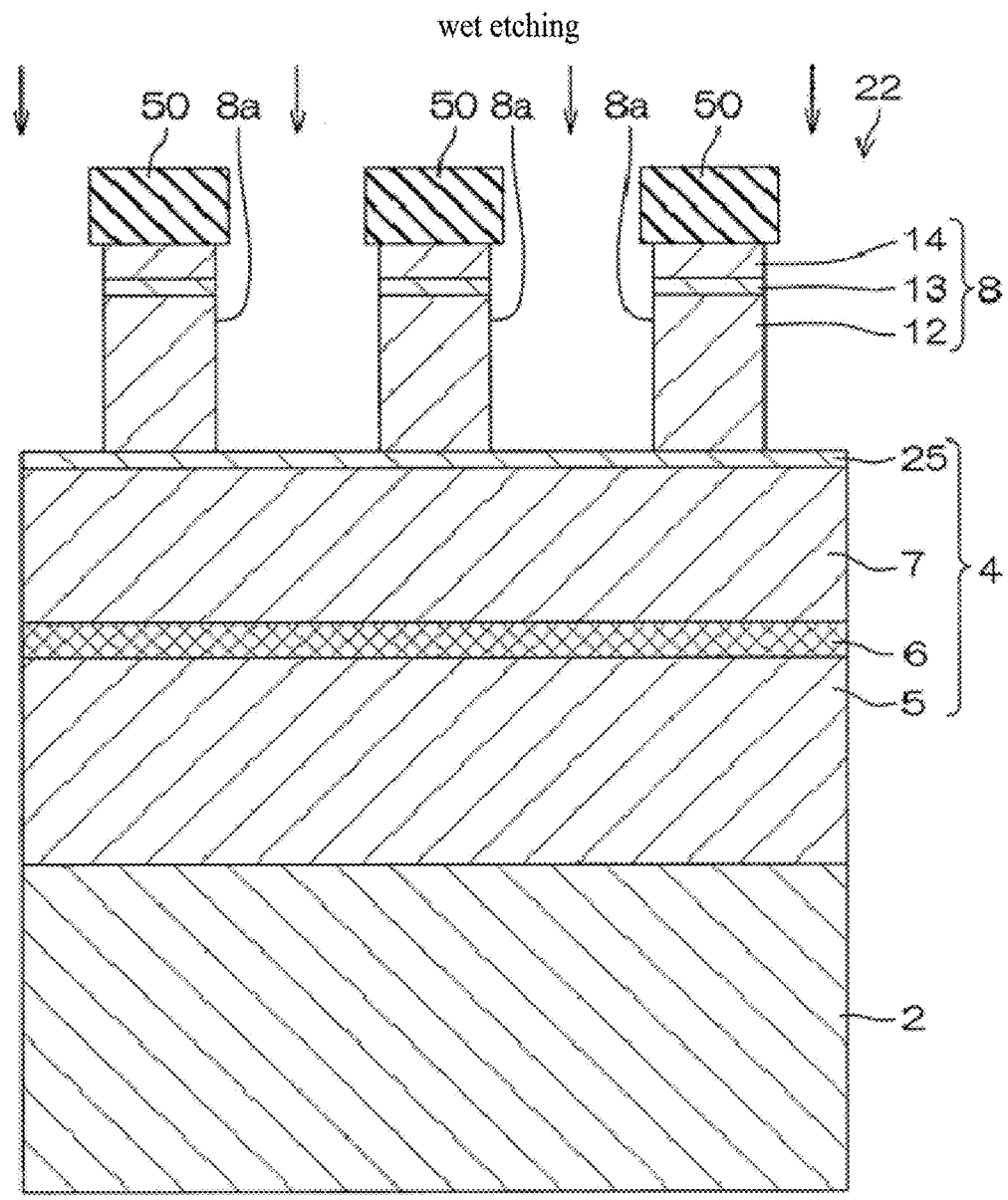
FIG. 6D is a longitudinal cross-sectional view showing a next step of FIG. 6C.

Then, referring to FIG. 6D, the p-type ridge clad layer 12 is selectively removed by wet etching with the hard mask 50 until the p-type etching stop layer 25 is exposed. In this step, the sidewall portions of the p-type contact layer 14 and the p-type discontinuous buffer layer 13 are removed with an amount corresponding to the thickness of the p-type ridge clad layer 12 retained in the step of FIG. 6C.

Figure 7B:
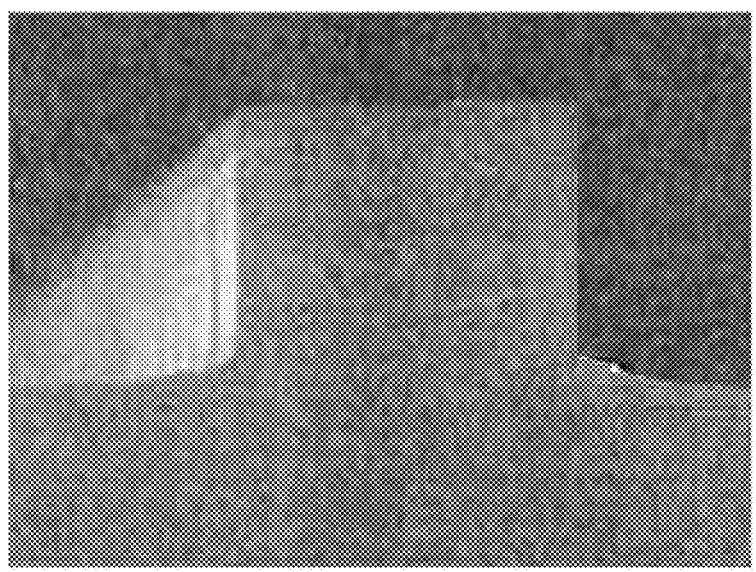
FIG. 7B is an SEM image showing a waveguide structure formed by a dry etching step of the present invention.

In this way, as shown in the SEM image of FIG. 7B, which shows the waveguide structure 8 formed by the dry etching step of the present invention, the waveguide structure 8 is formed to have a vertical ridge with a side surface 8a rising vertically with respect to the surface of the substrate 2. The hard mask 50 is removed after the waveguide structures 8 are formed.

Figure 6E:
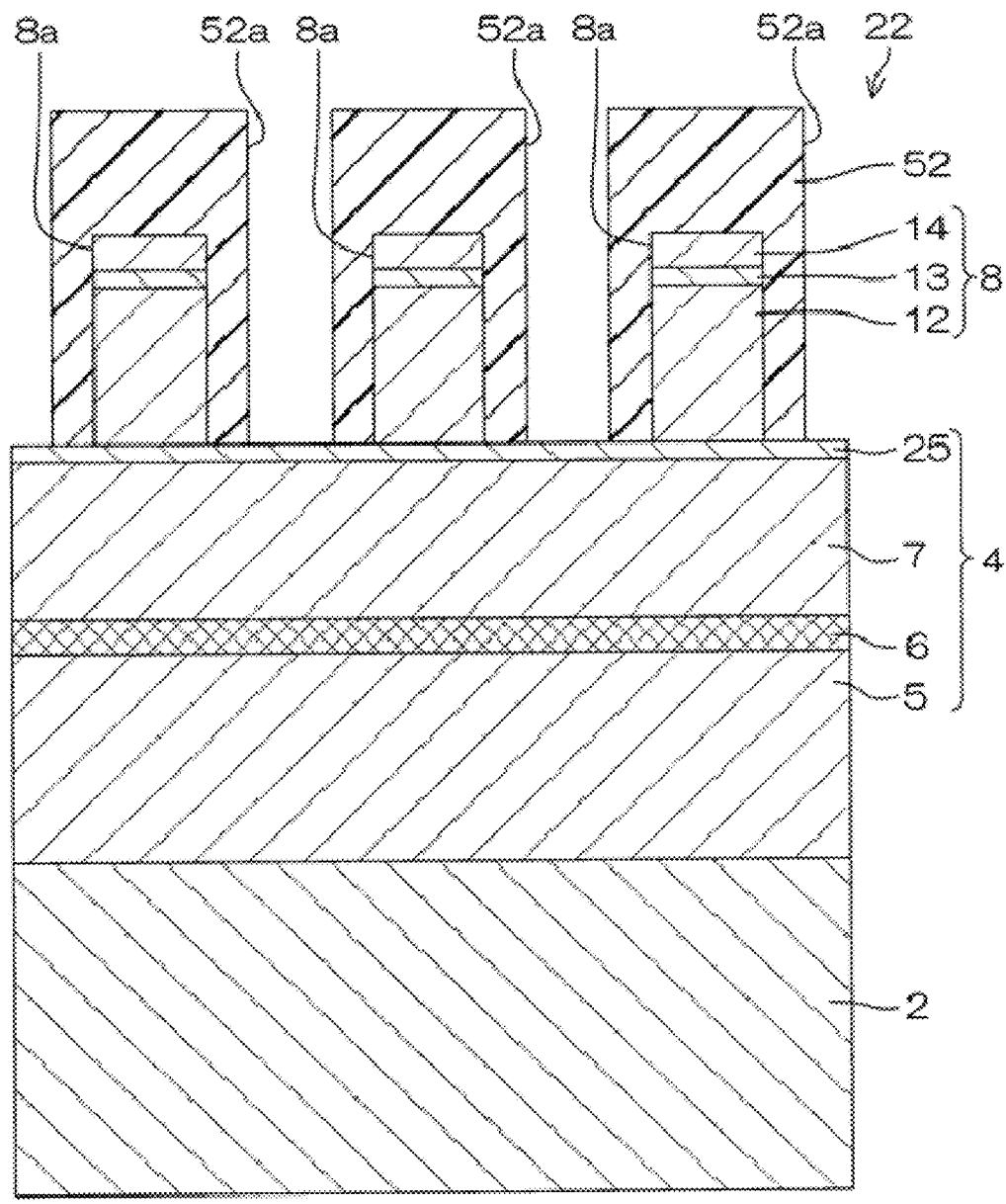
FIG. 6E is a longitudinal cross-sectional view showing a next step of FIG. 6D.
Figure 6F:
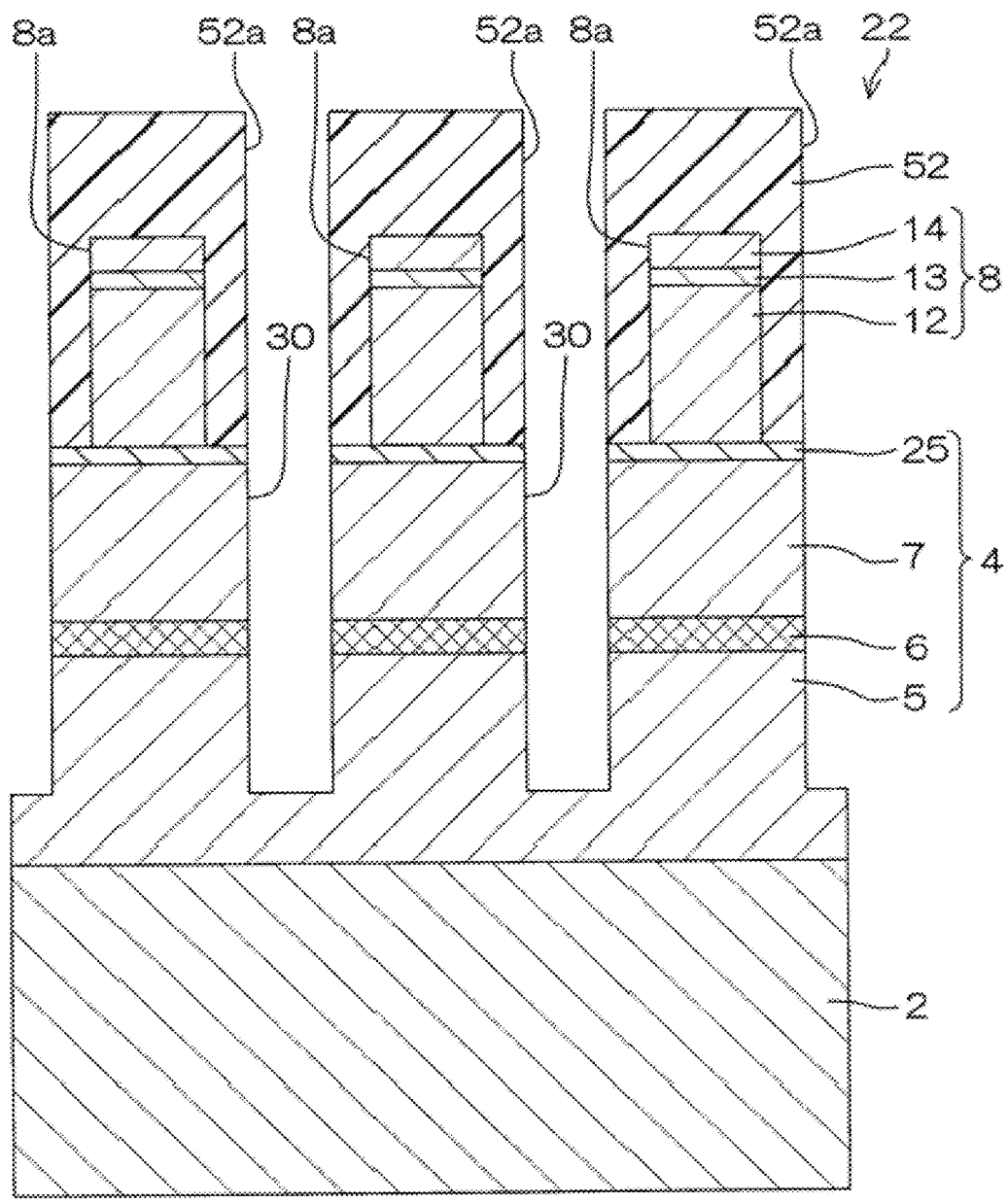
FIG. 6F is a longitudinal cross-sectional view showing a next step of FIG. 6E.

Then, referring to FIG. 6E, a resist mask 52 selectively having an opening 52a in a region where the groove 30 is to be formed is formed on the p-type etching stop layer 25. Then, referring to FIG. 6F, excess portions of the p-type etching stop layer 25, the p-type clad layer 7, the active layer 6 and the n-type clad layer 5 are selectively removed by dry etching with the resist mask 52 (for example, RIE (Reactive Ion Etching) method). As a result, a groove 30 is formed between adjacent waveguide structures 8 for dividing the active layer 6. The resist mask 52 is removed after the groove 30 is formed.

Figure 6G:
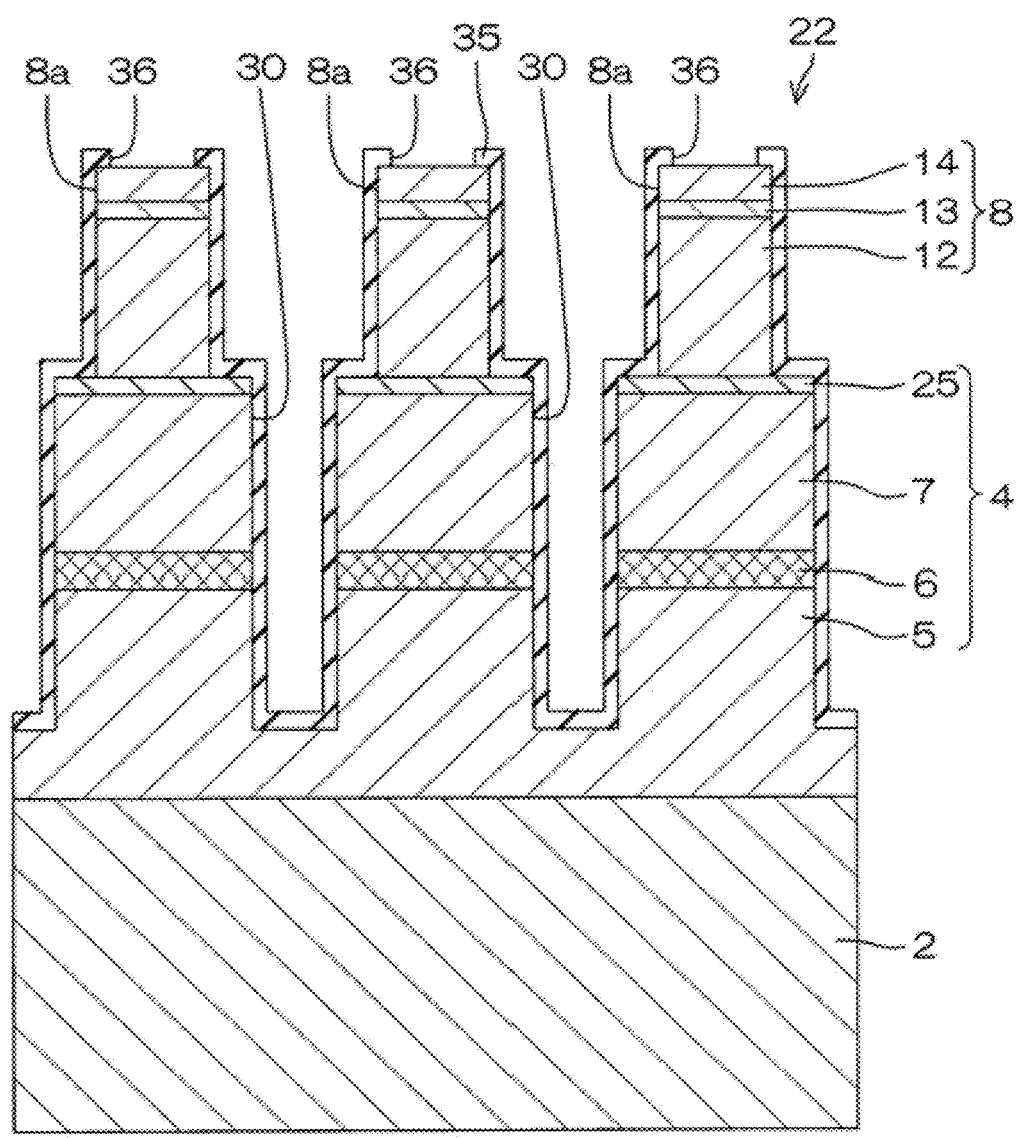
FIG. 6G is a longitudinal cross-sectional view showing a next step of FIG. 6F.

Then, referring to FIG. 6G, an insulating film 35 is formed by depositing silicon nitride or silicon oxide with, for example, CVD (Chemical Vapor Deposition). Then, excess portions (the portions corresponding to the inner region 22 of each waveguide structure 8) of the insulating film 35 are selectively removed by etching with a mask to form a contact hole 36.

Figure 6H:
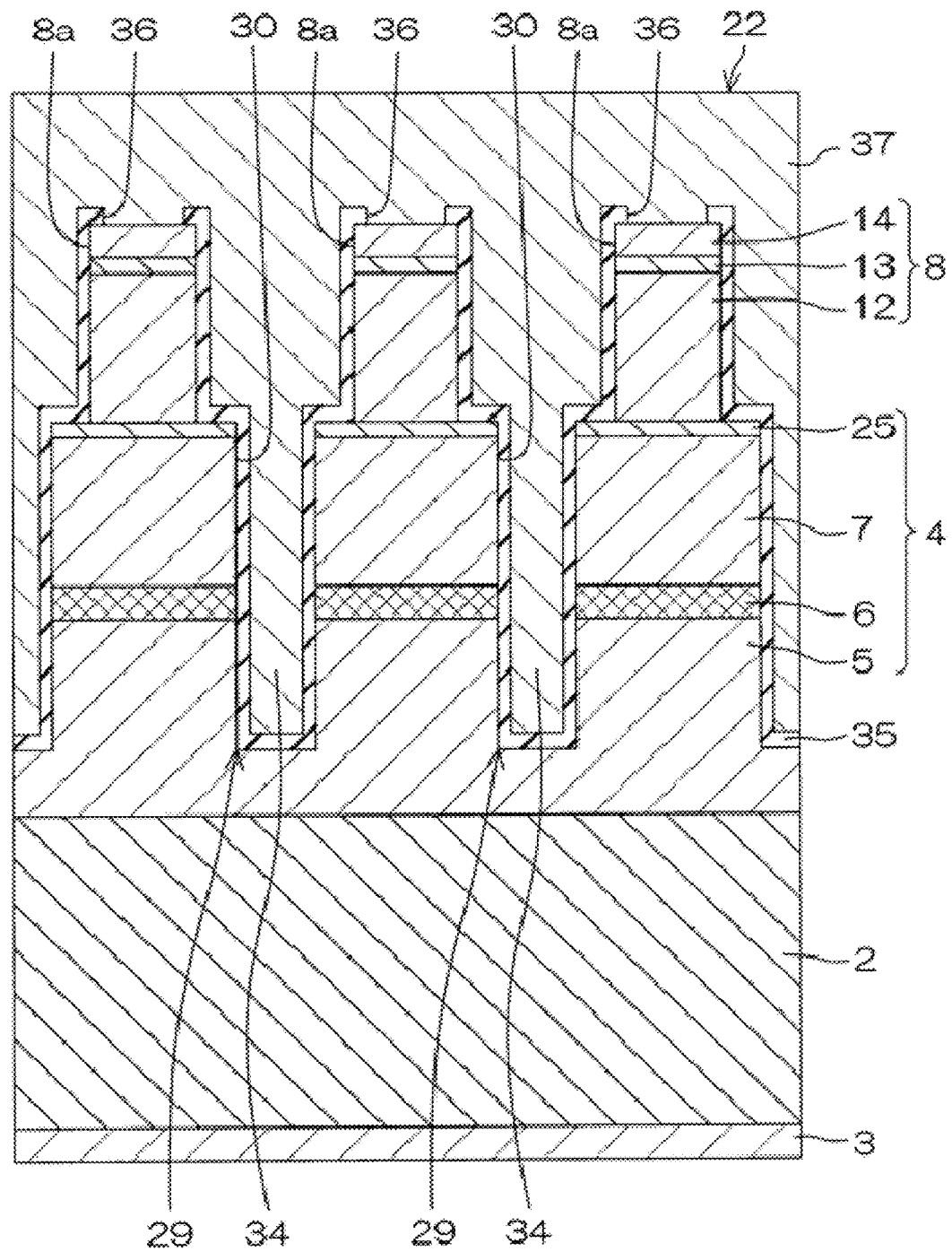
FIG. 6H is a longitudinal cross-sectional view showing a next step of FIG. 6G

Then, referring to FIG. 6H, a surface metal 37 is formed on the insulating film 35, and a back side metal 3 is formed on the back side of the substrate 2. The surface metal 37 and the back side metal 3 can be formed by electroplating or electroless plating. The semiconductor laser device 1 is manufactured by the above steps.

Although embodiments of the present invention have been described above, the present invention can also be applicable to other embodiments.

For example, in the described embodiment, an example in which 10 waveguide structures 8 are formed is described, but 10 or more waveguide structures 8 can be formed.

Figure 8:
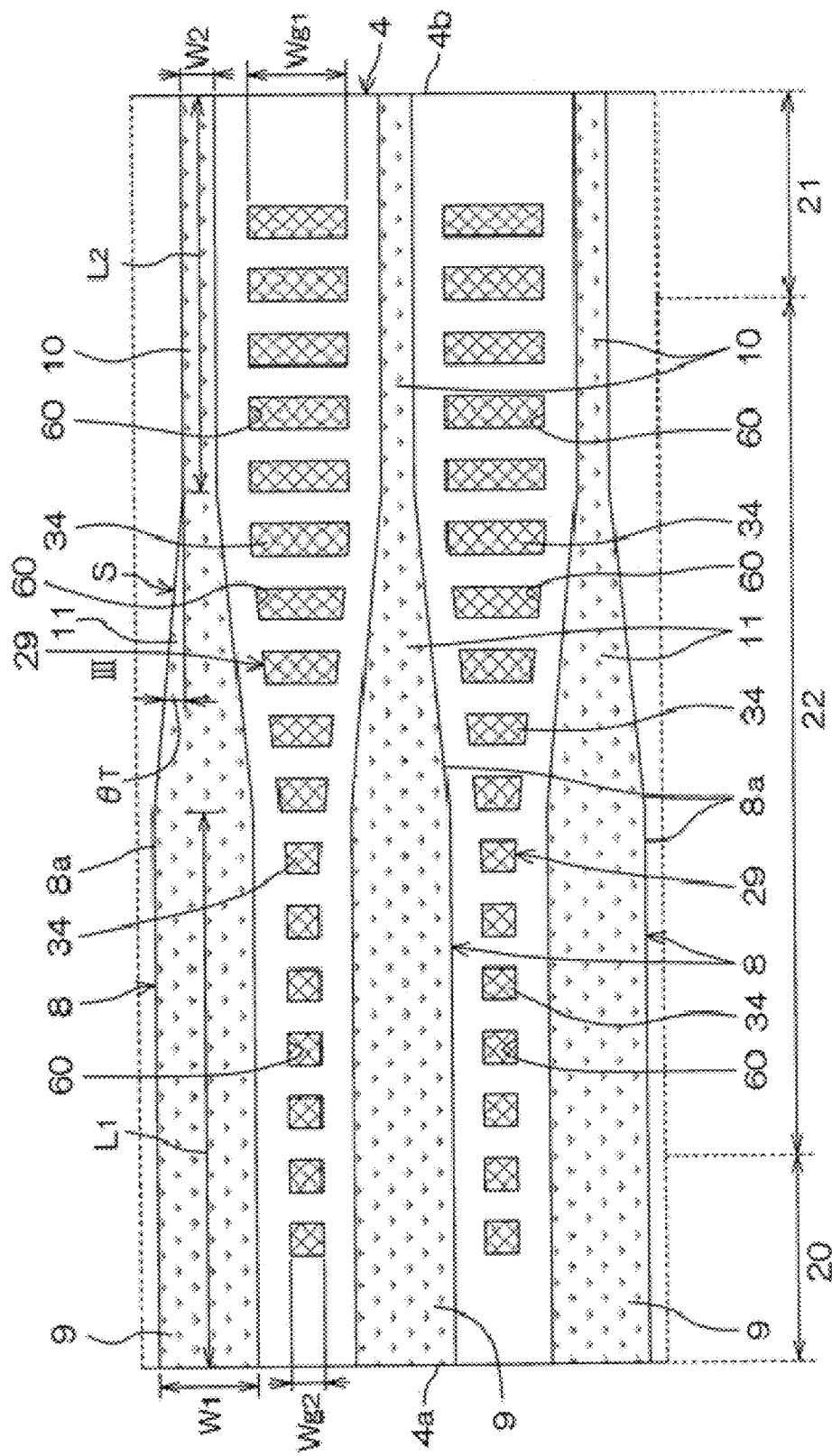
FIG. 8 is an enlarged top view of a portion corresponding to FIG. 2, and is a view showing a variation of the groove.

In the described embodiment, an example in which the semiconductor laser device 1 includes a groove 30 formed to have a horn shape in top view with a pattern opposite to the waveguide structure 8 is illustrated (referring to FIG. 2). However, for replacing the grooves 30 or in addition to the grooves 30, the semiconductor laser device 1 can include a plurality of grooves 60 formed intermittently along the longitudinal direction of the waveguide structures 8 between adjacent waveguide structures 8 as shown in FIG. 8. In this configuration, the plurality of grooves 60 is formed in such a manner that the groove width (the width of the opening) gradually changes according to the space between the waveguide structures 8. By this configuration, the same effect as that in the described embodiment is achieved.

Figure 9:
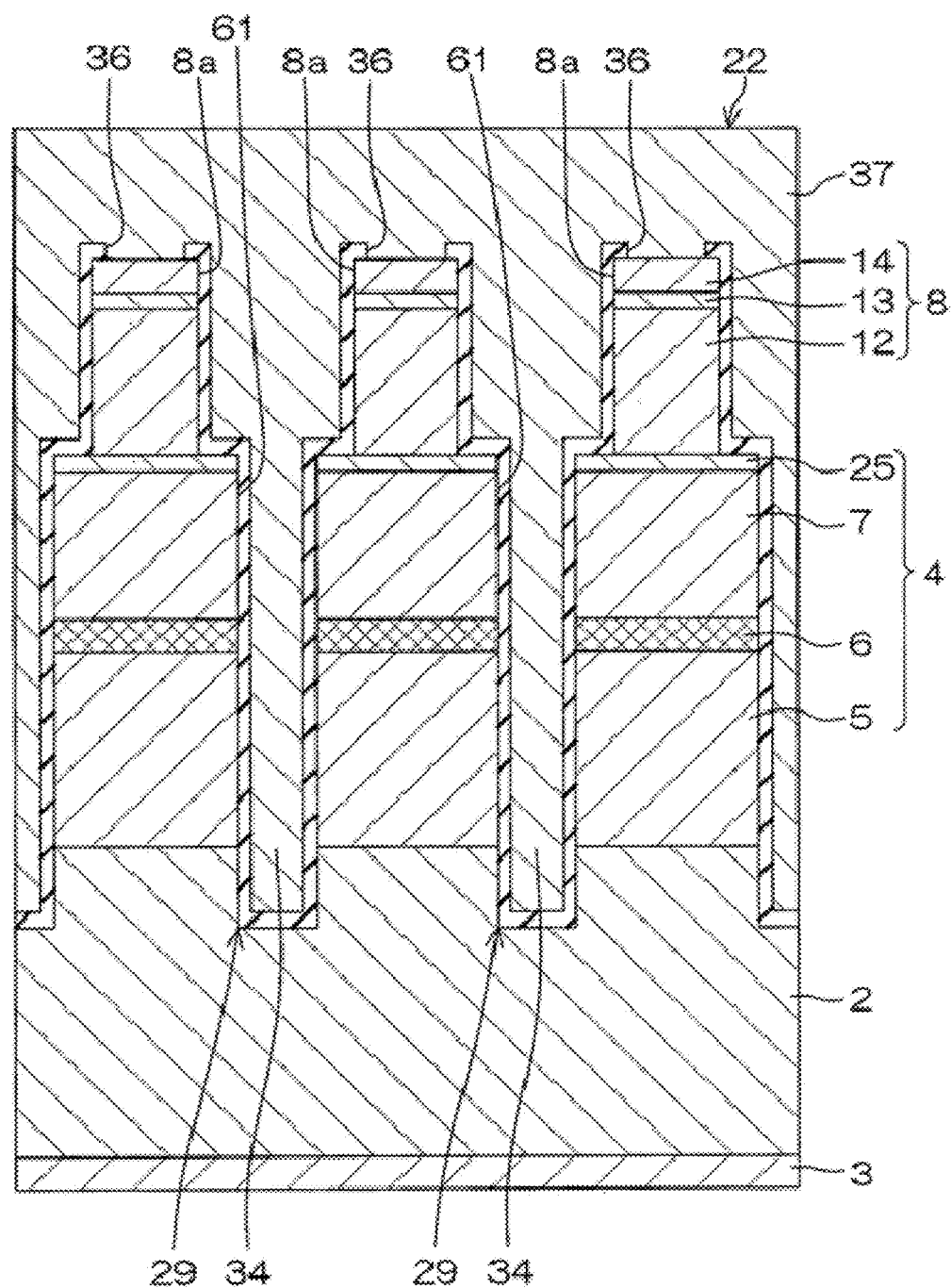
FIG. 9 is a longitudinal cross-sectional view of a portion corresponding to FIG. 3, and is a view showing a variation of the groove.

In the described embodiment, an example in which the bottom of the groove 30 is disposed in the n-type clad layer 5 is illustrated. However, for replacing the grooves 30 or in addition to the grooves 30, grooves 61 can be formed as shown in FIG. 9. The grooves 61 divide the p-type etching stop layer 25, the p-type clad layer 7, the active layer 6 and the n-type clad layer 5, and the bottoms of the grooves 61 are disposed in the substrate 2.

Figure 10:
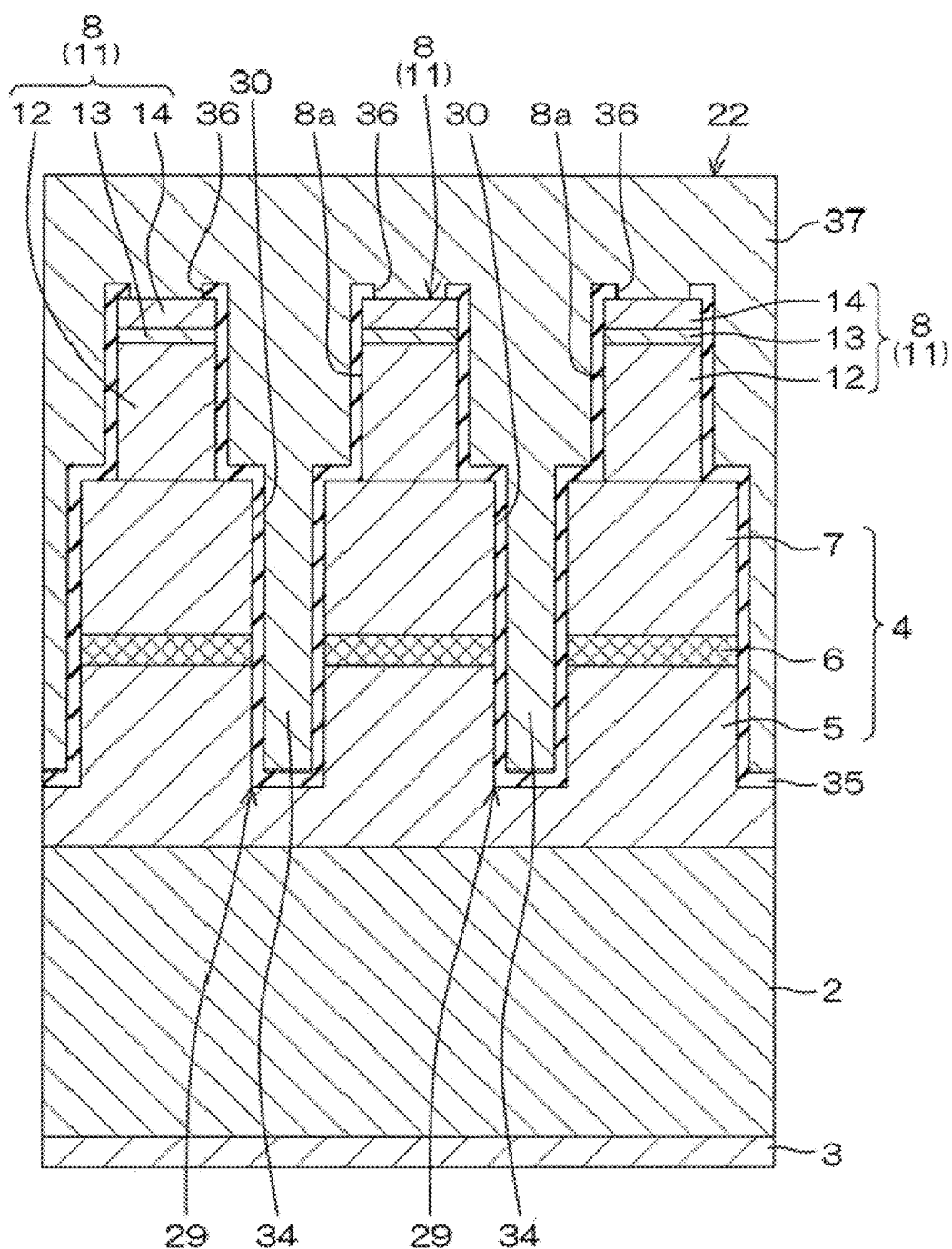
FIG. 10 is a longitudinal cross-sectional view of a portion corresponding to FIG. 3, and is a view showing a variation of the semiconductor layer.

In the described embodiment, an example in which the semiconductor layer 4 including the p-type etching stop layer 25 is formed is illustrated. However, it is not necessary to form the semiconductor layer 4 including the p-type etching stop layer 25 as long as the waveguide structure 8 with the vertical ridge can be formed by the etching condition. In the case that the semiconductor layer 4 does not include the p-type etching stop layer 25, as shown in FIG. 10, the p-type ridge clad layer 12 of the waveguide structure 8 is directly laminated on the p-type clad layer 7 of the semiconductor layer 4.

In the described embodiment, the semiconductor laser device 1 can comprise a heat sink which is thermally connected to the divider 29 (the heat dissipation material 34). By the heat sink, the heat absorbed by the divider 29 can be well dissipated to the outside. Additionally, the heat sink can also be thermally connected to the surface metal 37.

Various design changes can be made in the scope of the matters recited in claims.

What is claimed is:

1. A semiconductor laser device, comprising:
   a substrate;
   a first conductivity type clad layer on the substrate;
   an active layer on the first conductivity type clad layer;
   a second conductivity type clad layer on the active layer;
   a plurality of waveguide structures on the second conductivity type clad layer, each having a ridge of a horn shape in top view; and
   a divider between adjacent waveguide structures;
   wherein the divider comprises a groove dividing the active layer, and a metal containing heat dissipation material filled in the groove and having a thermal conductivity higher than a thermal conductivity of a semiconductor layer comprising the first conductivity type clad layer, the active layer, and the second conductivity type clad layer, and
   a length of the divider is shorter than a length of one of the plurality of waveguide structures in an extending direction of the groove in top view.

2. The semiconductor laser device of claim 1, wherein the groove of the divider has a depth that divides the second conductivity type clad layer and the active layer, and reaches the first conductivity type clad layer.

3. The semiconductor laser device of claim 1, wherein the groove of the divider divides the second conductivity type clad layer, the active layer and the first conductivity type clad layer.

4. The semiconductor laser device of claim 1, wherein the groove of the divider is between adjacent waveguide structures and formed to extend along the waveguide structures, and a width of the groove changes according to a space between the waveguide structures.

5. The semiconductor laser device of claim 1, wherein the divider is intermittently and plurally formed in a longitudinal direction of the waveguide structures between adjacent waveguide structures.

6. The semiconductor laser device of claim 1, wherein each of the waveguide structures has a vertical ridge with a side surface rising vertically.

7. The semiconductor laser device of claim 1, wherein each of the waveguide structures comprises a second conductivity type ridge clad layer on the second conductivity type clad layer and a contact layer on the ridge clad layer.

8. A semiconductor laser device, comprising:
   a substrate;
   a first conductivity type clad layer on the substrate;
   an active layer on the first conductivity type clad layer;
   a second conductivity type clad layer on the active layer;
   an etching stop layer on the second conductivity type clad layer;
   a plurality of waveguide structures on the etching stop layer, each having a ridge of a horn shape in top view; and
   a divider between adjacent waveguide structures;
   wherein the divider comprises a groove dividing the active layer, and a metal containing heat dissipation material filled in the groove and having a thermal conductivity higher than a thermal conductivity of a semiconductor layer comprising the first conductivity type clad layer, the active layer, and the second conductivity type clad layer.

9. The semiconductor laser device of claim 8, wherein the etching stop layer comprises a semiconductor material having an etching selectivity with respect to the waveguide structures.

10. A method for manufacturing the semiconductor laser device of claim 8, comprising:
    a step of forming the first conductivity type clad layer, the active layer, the second conductivity type clad layer, the etching stop layer, and a semiconductor material layer served as a base of the waveguide structures sequentially on the substrate;

a dry etching step of selectively removing the semiconductor material layer with a mask to such an extent that the etching stop layer is not exposed by dry etching;

a wet etching step of selectively removing the semiconductor material layer with the mask, after the dry etching step, until the etching stop layer is exposed.

11. The semiconductor laser device of claim 1, wherein the plurality of waveguide structures includes at least ten waveguide structures.

12. The semiconductor laser device of claim 1, wherein each of the plurality of waveguide structures has a side surface rising vertically with respect to a surface of the substrate.

13. The semiconductor laser device of claim 1, wherein the divider is between a portion of the semiconductor layer and another portion of the semiconductor layer in an extending direction of the groove in top view.

14. The semiconductor laser device of claim 1, wherein the divider has a first width and a second width smaller than the first width in top view, the first width and the second width being along a direction along which the plurality of waveguide structures are arranged.

15. The semiconductor laser device of claim 1, wherein a bottom of the groove is disposed in the first conductivity type clad layer, and faces to a surface of the substrate via a portion of the first conductivity type clad layer.

* * * * *